United States Patent [19]

Linderman

[11] Patent Number: 5,737,192
[45] Date of Patent: Apr. 7, 1998

[54] DENSITY IMPROVEMENT IN INTEGRATION MODULES

[75] Inventor: Richard W. Linderman, Rome, N.Y.

[73] Assignee: The United States of America as represented by the Secretary of the Air Force, Washington, D.C.

[21] Appl. No.: 499,979

[22] Filed: Jul. 10, 1995

Related U.S. Application Data

[63] Continuation-in-part of Ser. No. 58,691, Apr. 30, 1993, Pat. No. 5,432,681.
[51] Int. Cl.$^6$ .................................. H01R 23/68
[52] U.S. Cl. .................. 361/790; 361/748; 361/761; 361/764; 257/686; 257/777
[58] Field of Search .................. 361/744, 735, 361/790, 748, 791, 761, 764; 257/686, 777, 624, 700, 758; 174/261–264, 52.1

[56] References Cited

U.S. PATENT DOCUMENTS

| | | | |
|---|---|---|---|
| 4,525,921 | 7/1985 | Carson et al. | 29/557 C |
| 4,617,160 | 10/1986 | Belanger et al. | 264/40.1 |
| 4,706,166 | 11/1987 | Go | 361/403 |
| 4,877,752 | 10/1989 | Robinson | 437/51 |
| 4,953,005 | 8/1990 | Carlson et al. | 357/80 |
| 4,984,358 | 1/1991 | Nelson | 29/830 |
| 5,067,233 | 11/1991 | Solomon | 29/852 |
| 5,099,309 | 3/1992 | Kryzaniwsky | 357/75 |
| 5,528,414 | 6/1996 | Oakley | 359/257 |
| 5,552,596 | 9/1996 | Ravetto et al. | 257/777 X |

*Primary Examiner*—Leo P. Picard
*Assistant Examiner*—Jayprakash N. Gandhi
*Attorney, Agent, or Firm*—Harold L. Burstyn; William G. Auton

[57] ABSTRACT

Chip-like stacks of thinned chips are mounted in wells etched into a substrate. A "chip-like" stack is a stack of chips, which in the aggregate have a height approximately equal to that of a single conventional chip. These chip-like stacks are mounted in a variety of packages. In a preferred embodiment, the stacks are mounted in wells within the substrate of an integrated circuit and the stack is provided with a patterned overlay so that all the circuit connections can be made from the upper surface of the stack. The patterned overlay is protected by a planar insulator. A plurality of substrates may be stacked, one upon the other.

3 Claims, 7 Drawing Sheets

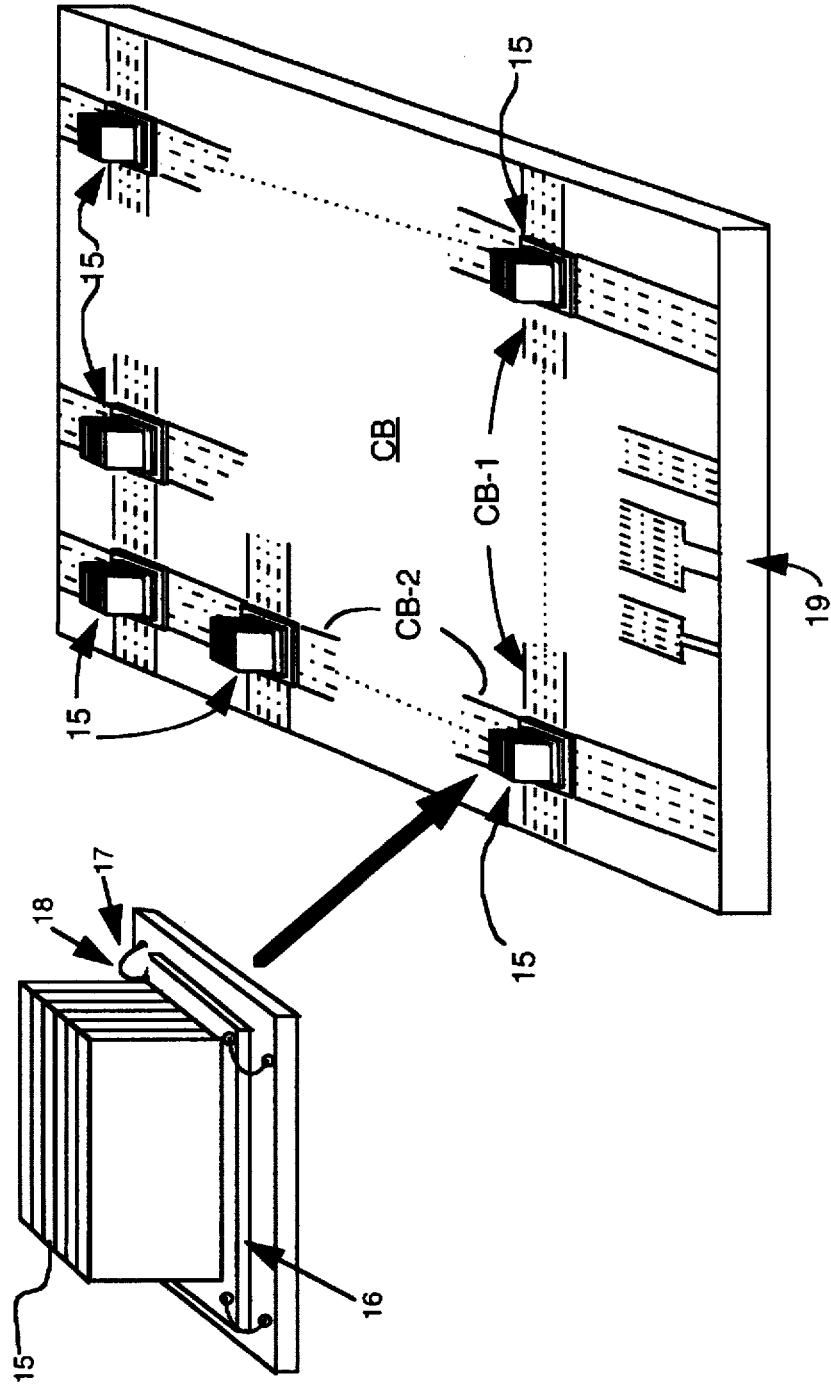

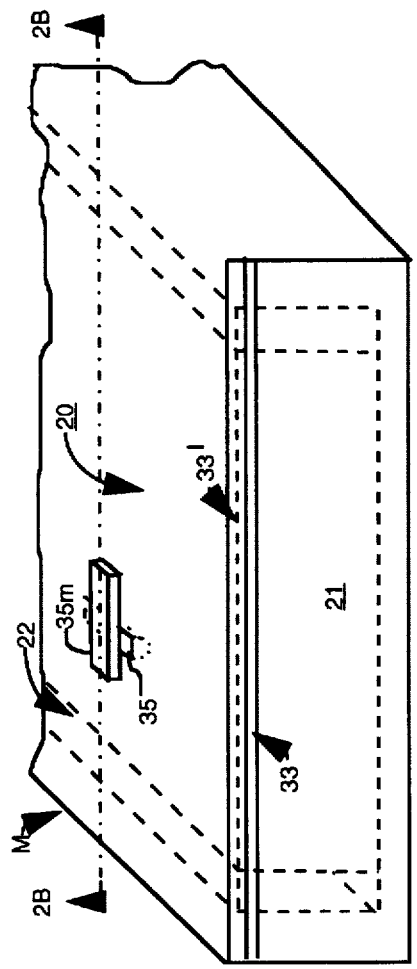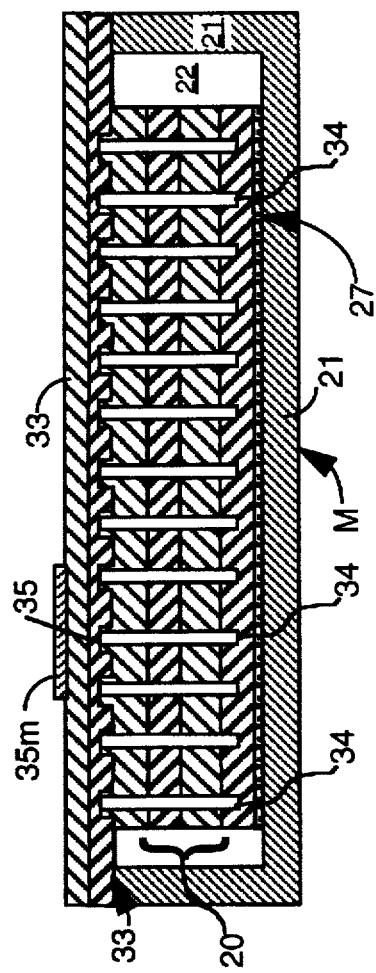
Figure 2A
Figure 2B

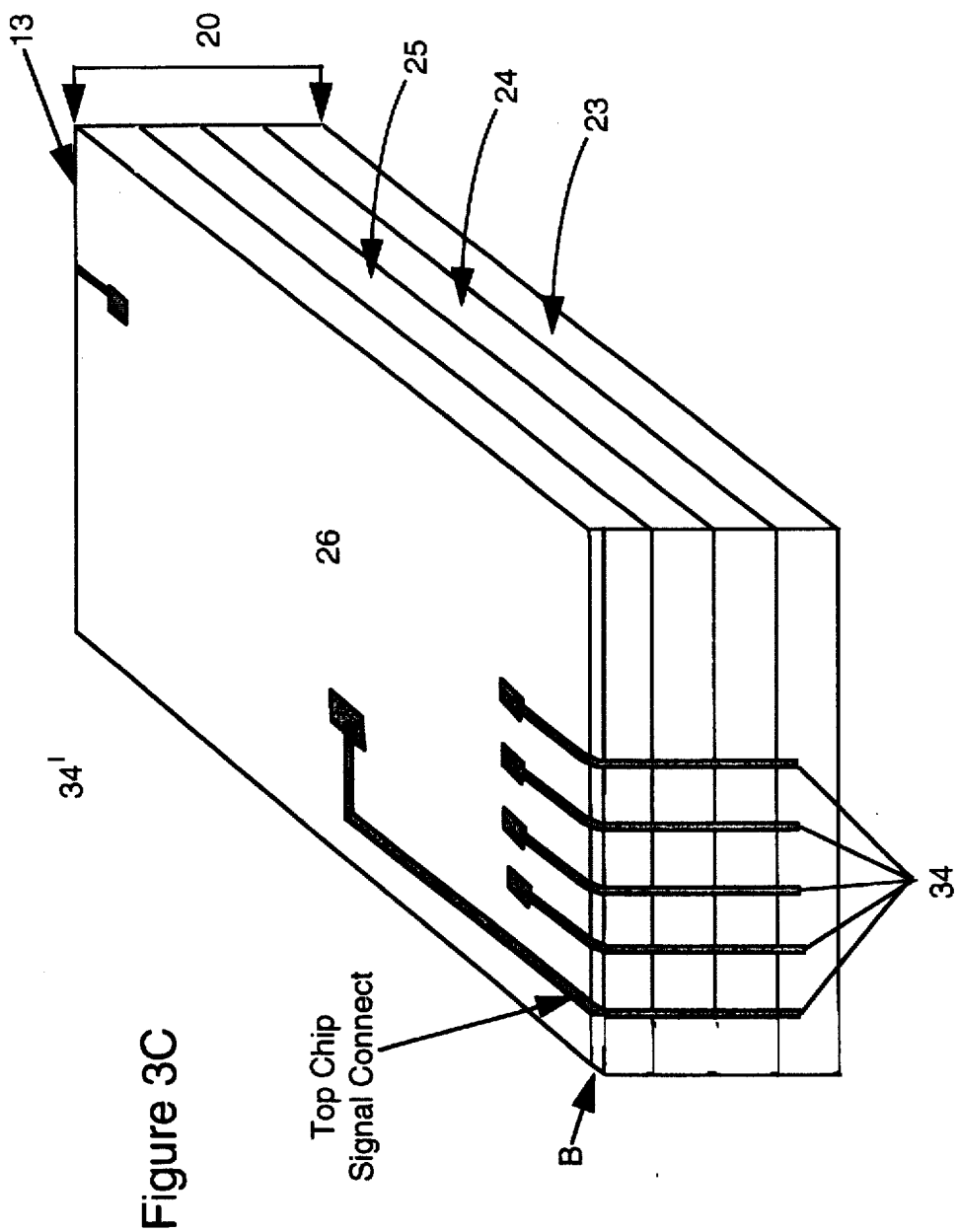

DENSITY IMPROVEMENT IN INTEGRATION MODULES

CROSS-REFERENCE TO RELATED APPLICATION

This application is a continuation-in-part of Application Ser. No. 08/058,691 filed on 30 Apr. 1993, U.S. Pat. No. 5,432,681 issued 11 Jul. 1995, the disclosure of which is incorporated herein by reference.

STATEMENT OF GOVERNMENT INTEREST

The invention described herein may be manufactured and used by or for the Government for governmental purposes without the payment of any royalty thereon.

BACKGROUND

This invention relates to density improvement in a patterned-overlay, Hybrid Wafer-Scale Integration (HWSI) module by replacing the individual dies with chip-like stacks of thinned dies. While conventional hybrid wafer-scale integration allows chip dies to be placed edge-to-edge, this does not achieve desired compactness. A "die" is a chip-like portion separated from a larger integrated circuit structure.

There is a need for packaging memory dies more compactly to support the development of a wafer-scale vector or signal processor (WSVP or WSSP). Each element in an illustrative WSVP requires 16 memory dies and one processor die. If a conventional two-dimensional HWSI module is used in each processor, the element would require an area of about four square inches, of which about 16/19 of the area would be occupied by memory dies. This would result in interconnects as long as four inches, and would unacceptably slow the memory transferred to a central processor unit (CPU) interface.

An objective of the invention is to place at least four processor elements into a four square inch area, not just one.

"Sugar cube" memories are so-called because each memory element describes a lump of sugar. They are described in U.S. Pat. No. 4,525,921 (Carson et al.) and 4,617,160 (Belanger et al.) with stacked memories horizontally mounted on top of a HWSI substrate. This approach saves area, but introduces a "skyline" effect that inhibits the stacking of HWSI modules.

OTHER PRIOR ART

A search of the prior art disclosed the following patents:

Go et al. U.S. Pat. No. 5,104,820 describes a method of fabricating electronic circuitry with stacked integrated circuit (IC) layers. Chip-containing silicon wafers are modified to create IC chips having second level metal conductors on top of passivation. The metal of the second level conductors is different from the metallization included in the IC circuitry. The modified chips are cut from the wafers and stacked to form multi-layer IC devices. After stacking, a selective etching step removes any material which might interfere with the metallization formed on the access plane. Metal terminal pads are formed in contact with the terminals of the second level conductors on the stacked chips.

Nelson U.S. Pat. No. 4,984,358 is directed to a method in which holes are made through a wafer having a plurality of integrated circuit dies. The dies include bonding pads connected to the integrated circuits in the dies. Holes are placed between the dies and adjacent the pads, and a layer of insulating material is placed over the wafer, and in the outer periphery of the holes. An electrically conductive connection is patterned between the top of each bonding pad and the inside of the insulating material in an adjacent hole. The dies are then separated from each other and can be assembled in a stack.

Carlson U.S. Pat. No. 4,953,005 describes a packaging system for stacking integrated circuits in which integrated circuit dies are mounted to the interconnection leads on a frame of Tape Automatic Bonding (TAB) film. Each frame of the TAB film, with an attached integrated circuit die, is affixed to an electrically insulating, thermally conductive plate to form a sandwich structure. A number of such sandwich structures are bonded together to form a stack of sandwiches. The interconnection leads of each sandwich in the stack are selectively and electrically connected to interconnection leads of other sandwiches in the stack to form a system of electrically interconnected integrated circuits.

Robinson U.S. Pat. No. 4,877,752 is directed to three dimensional packaging for focal plane signal processing electronics. Silicon dies are stacked together vertically and bonded to form an assembly. A gold ribbon lead is bonded to the face of each die and is used to provide for conductive connection to the next module assembly.

Although the foregoing patents relate to methods of assembling and packaging stacked electronic circuitry, they do not describe a method for densifying modules with respect to the planar surface of a substrate.

SUMMARY OF THE INVENTION

This invention improves upon sugar-cube chip technology by producing chip-like stacks of thinned dies which can be packaged in lieu of individual dies. "Chip-like" designates a stack of chips, which in the aggregate have a height equal to that of a single conventional chip. These chip-like stacks can be mounted in a variety of packages. In a preferred embodiment, the stacks are mounted in wells within the substrate of an integrated circuit, and the stack is provided with a patterned overlay so that all the circuit connections can be made from the upper surface of the stack.

The most immediate and significant application of this invention is to the stacking of dies four to eight deep and packaging them where single chips currently reside. The invention will find significant utility in replacing memory dies, since memory dies tend to dominate the total die count in circuit structures.

However, the invention can also be used to stack processors on top of one another, e.g., to form a processor and its self checking pair (watchdog) processor. The invention can further be generalized to stack arbitrary chips of different sizes, since the flexibility of the pattered overlay can interconnect voids created by the different chip sizes.

While the prior art teaches the stacking of chips on top of a substrate, this invention can use a patterned overlay HWSI, and place the chips into wells that are custom etched into the substrate. Interconnects to the chips can be by planarized (flat) film placed over the tops of all chips. These are then placed into an HWSI substrate, providing the desired density while preserving surface planarity. This planarization further allows the substrates to be stacked, an advantage that is lost if memory cubes are mounted on top of the substrate.

This invention permits stacked dies having a total thickness approaching that of a conventional chip. Hence, the chip-like stacks of the invention preserve substrate planarity. This allows heat to be removed efficiently from a stack of substrates, since there are no air gaps between layers when local hot spots could form and interfere with signal processing.

In a method of forming an integration module in accordance with the invention the steps include (a) forming a stack of a plurality of wafers; (b) forming a well in a substrate; and (c) positioning the stack in the well of the substrate. The method further includes the step of providing electrical circuitry on the wafers. The electrical circuitry on the wafers can be implemented by printing. In a further step of the invention connection is made to the electrical circuitry of the wafers.

In accordance with an aspect of the method the stack has an outer surface, and a further step is to connect the electrical circuitry of the wafers to the outer surface of the stack. The well can have a receiving surface to which the stack is conformed. Each wafer has a height that can be less than the depth of the wafer. When the stack is formed of a plurality of wafers the well can be formed with a depth exceeding the height of the stack, or less than the height of the stack.

In accordance with another aspect of the method, the substrate has a surface surrounding the well, and a further step is to provide a patterned overlay, which can be insulated, on the surrounding surface. The stack can be bonded to the substrate in the well.

Still another aspect of the method includes forming a further well in the substrate and positioning a further stack in the further well of the substrate.

In a method of the invention for forming an integration module, steps include (a) forming a well in a substrate; and (b) positioning a wafer in the well of the substrate.

In a method of the invention for using an integration module, the steps include (a) connecting to a wafer positioned in a well in a substrate; and (c) energizing a connection to the wafer positioned in the well of the substrate.

The wafer can be a component of a stack of wafers positioned in the well, and a further step is to energize the stack of wafers positioned in the well of the substrate.

Another aspect of the method is to provide the substrate with a planar surface, and the wafers also can have planar surfaces.

The method wafers can be mounted upon one another in chip-like fashion, and bear electrical circuitry, with the stack having a side connection to the electrical circuitry. The stack has a top with respect to the well, and a further step is to extend the side connection to electrical circuitry along the top of the stack.

BRIEF DESCRIPTION OF THE DRAWINGS

For a better understanding of the nature and purposes of this invention, reference should be made to the following detailed specification and to the accompanying drawings, in which:

FIG. 1B is a perspective view of a local memory stack for the memory of FIG. 1A and the circuit board of FIG. 1C.

FIG. 1C is a perspective view of a circuit board employing local memory stacks of the kind illustrated in FIG. 1B;

FIG. 2A is a partial perspective view of an integration module of the invention.

FIG. 2B is a diagrammatic cross section of a preferred embodiment of a Hybrid Wafer Scale Integration Module in accordance with the invention, taken along the lines 2B–2B of FIG. 2A;

FIG. 3C is an alternative detail showing the connection of a chip-like stack to a top-surface conductor.

DETAILED DESCRIPTION

Figure 1A:
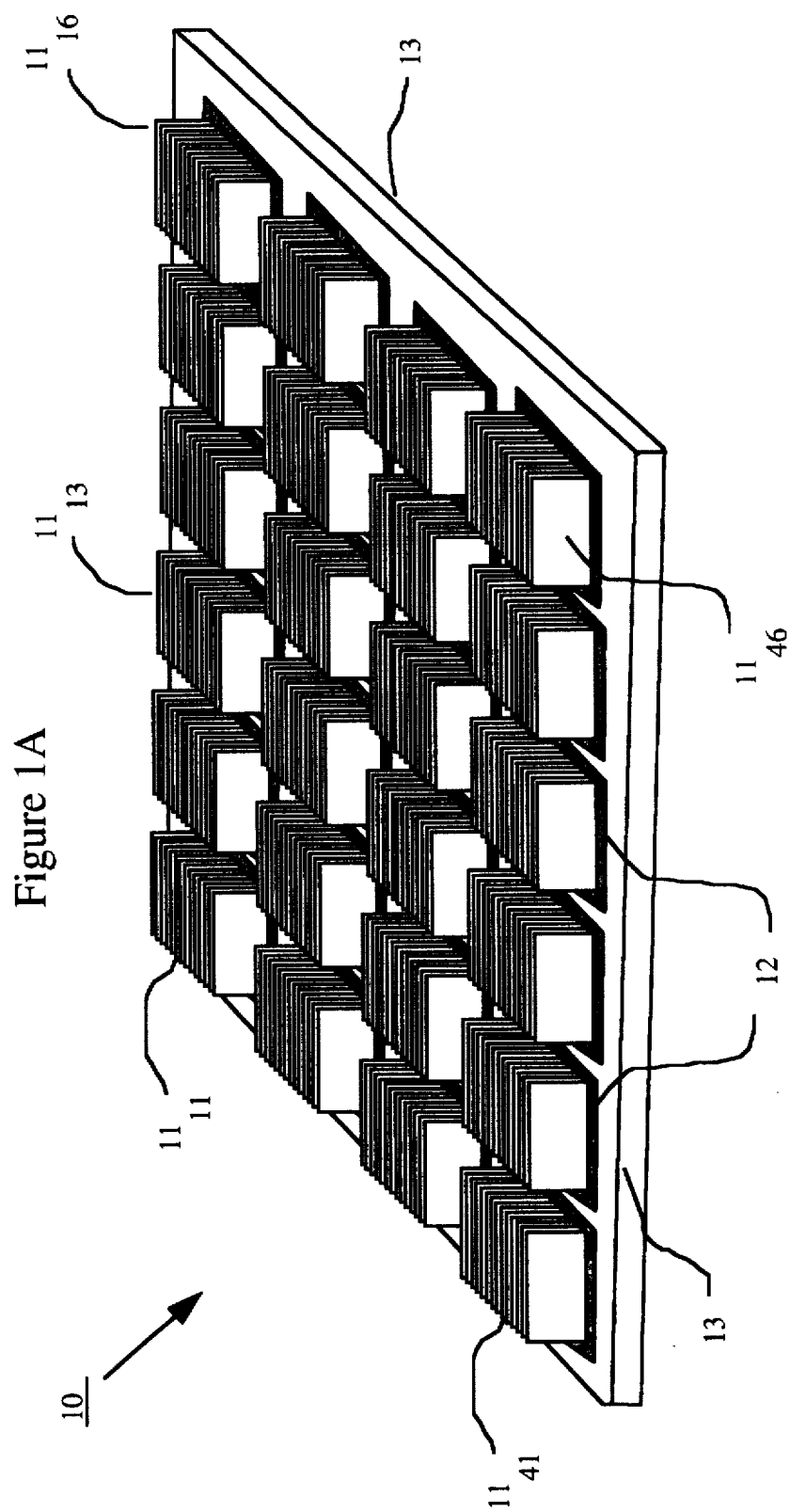
FIG. 1A is a perspective view of a solid-state memory employing horizontally disposed multi-layer modules.

With reference to the drawings, FIG. 1A shows a solid-state memory 10 with a set of local memory modules $11_{11}$ through $11_{56}$, where the subscripts indicate respective row and column positions. The local memory 10 forms a 5×6 array. Each module is a stack of layers horizontally positioned on a face 12 which is in turn positioned on a substrate 13. Taken together each stack $11_{xy}$ with its base 12 forms a memory chip or die. It is apparent that the memory 10 of FIG. 1A has the disadvantage of forming an irregular surface profile which detracts from desired chip densification and cause heat removal problems.

In FIG. 1B a memory chip 15 with a stack of layers is shown horizontally positioned on a memory substrate 16. The latter is connected to a base 17 to form a process chip 18, which is then positioned on a substrate 19, as shown in FIG. 1C. The overall circuit board CB of FIG. 1C illustratively includes 64 modules 15 with central and transverse communication fuses CB-1 and CB-2 on the substrate 19. In addition an interconnect set of fuses CB-3 not shown permits communication among all modules.

It is apparent that circuit board CB of FIG. 1C, with its modules 15, has the same surface disadvantage as the memory 10 of FIG. 1A. In order to achieve desired densification of chips and eliminate the disadvantageous surface characteristics shown in FIGS. 1A and 1C, the invention provides the illustrative integration module 20 shown in FIGS. 2A and 2B.

A hybrid wafer-scale integration module M has an alumina, aluminum nitride or silicon substrate 21 into which a depression is formed, such as a well 22, for example, by etching or machining. A plurality of very thin dies or chips 23, 24, 25 and 26 are mounted in a chip-like stack 20, and bonded to the substrate 21 by a suitable bonding material 27. While it is contemplated that a plurality of wells 22 may be made in a substrate, such as the substrate to accommodate a plurality of stacks, only one such well 22 is shown in FIGS. 2A and 2B. The stacks 20 are referred to as "chip-like", because each stack is very thin, so that the height of the stack is approximately that of a conventional single chip.

Chip thinning to 2 mils has been accomplished in the prior art. With an 80 mil substrate, 16 layer stacks of 4 mil die thickness can be produced within the skill of the art. The invention, however, was reduced to practice and is illustrated herein as using four 10 mil thick dies.

A patterned conductive overlay 33 is placed on the upper surface of the substrate 21, and electrical connections are made to the overlay 33 as seen in FIG. 2B, from a plurality of vertical bus lines 34 mounted on a side of the stack 20.

As seen in FIGS. 2A and 2B, the overlay 33 is covered with a planar layer 33' of insulation such as that sold under the trademark "Kapton"(T.M.).

In addition, a laser "via" is made in the insulation 33' to provide conductive access to the overlay 33. As seen in FIG. 2A the "via" is in the form of a rectangular notch 35 that has a "V"-cross section and is accessed by top surface metallization 35m.

Figure 3B:
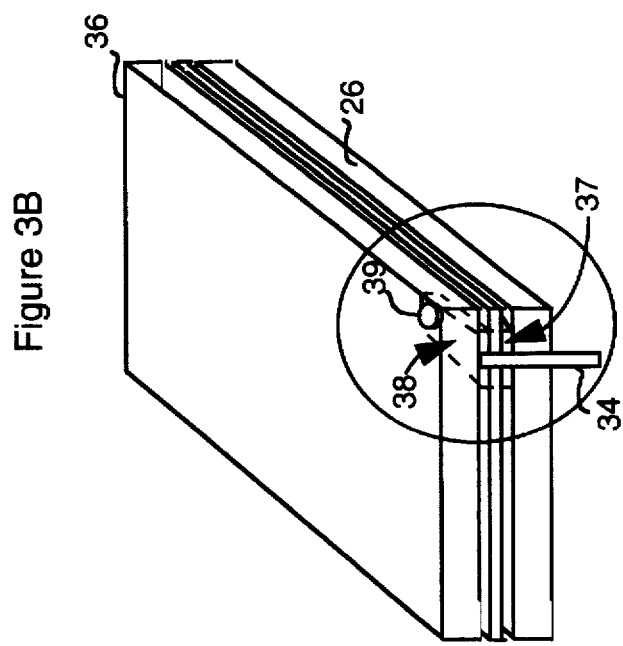
FIG. 3B is an enlarged view (not to scale) showing a detail of the invention circled in FIG. 3A.
Figure 3A:
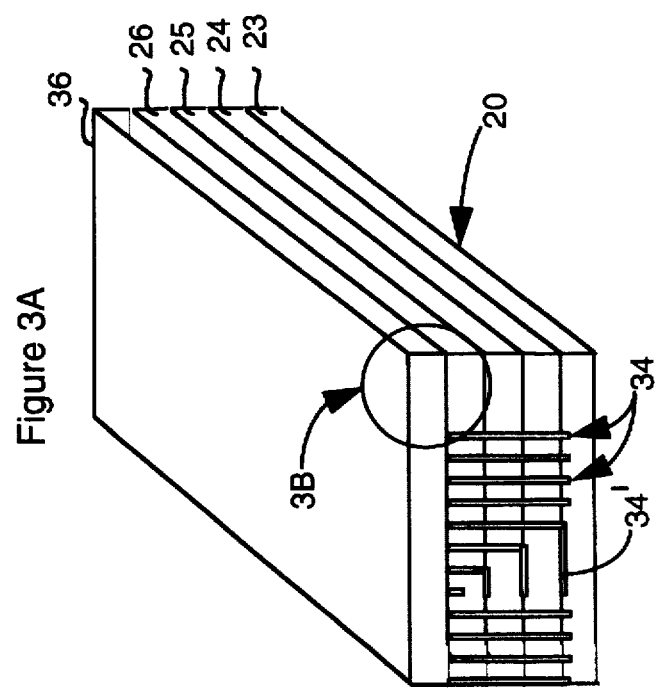
FIG. 3A is a three dimensional view of a single chip-like stack made in accordance with the invention.

An alternative technique for providing conductive access is illustrated in FIG. 3A where the chip-like stack 20 is covered with a cap chip 36. In addition to the vertical bus bars 34 other bus configurations are employed such as the L-shaped bus bars 34'. An illustrative connection of the vertical buses 34 is illustrated in FIG. 3B where connection to the cap chip 36 is by metallizations 34 and 38. In FIG. 3B the metallizations 37 and 38 are shown as metallic strips with the strip 37 positioned on the upper surface of wafer 26, while the strip 38 is positioned on the lower surface of the cap chip 36. It will be understood that the region between the cap chip 36 and wafer 26, and likewise between the strips 37 and 38 is insulated. For this condition connections to each chip are made through a metal pad 39 extending through cap chip 36 on the surface of the stack 20. With this arrangement, connections can be made to each of the chips in the stack.

The cap chip 36 is eliminated in FIG. 3C where the edges of the stack 20 are beveled so that the vertical buses 34 can traverse to the top of the stack without adverse breakage. This arrangement not only eliminates the cap 36, it simplifies construction of the stack 20 and improves thermal expansion characteristics of the stack.

Figure 4:
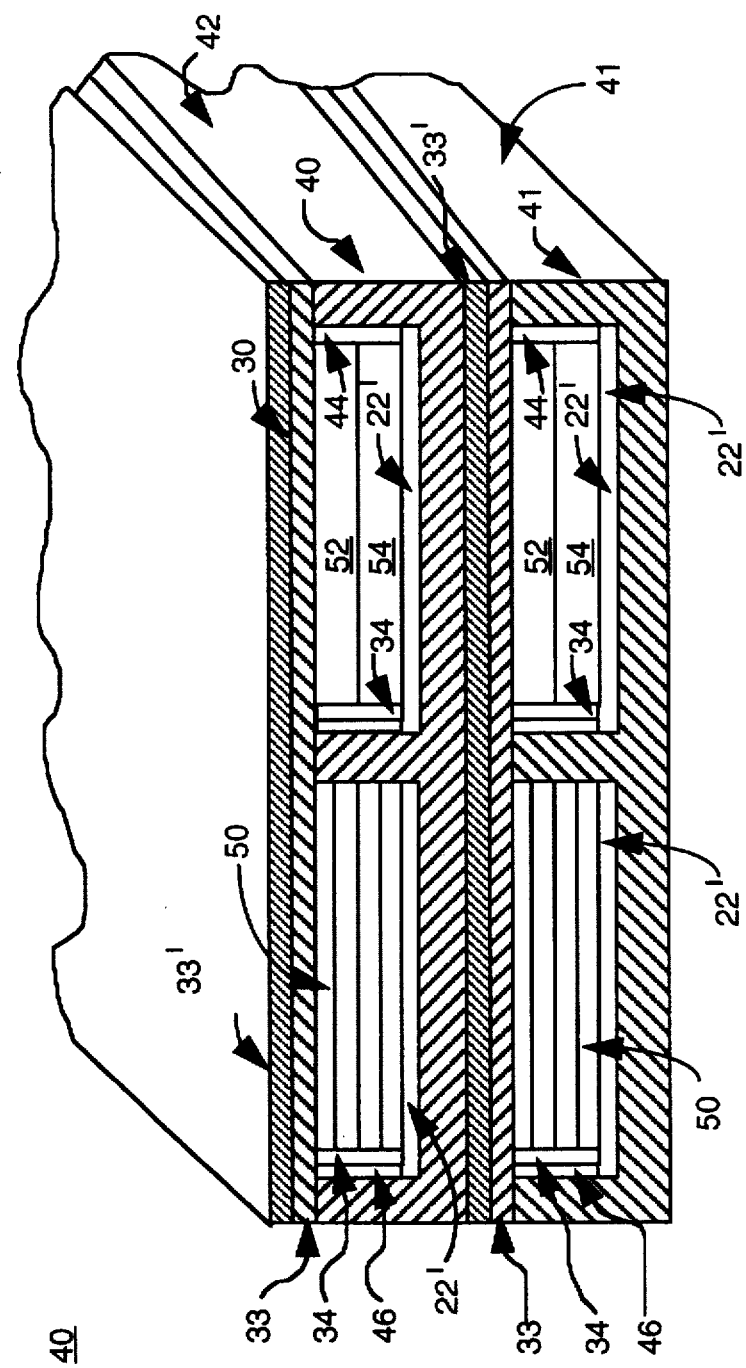
FIG. 4 is a view of a particular application showing stacked substrates each containing a plurality of chip-like stacks.

An alternative module 40, shown in FIG. 4, is basically the same as the module 20 shown in FIGS. 2A and 2B, except that the module 40 has a substrate 42 with two wells 44 and 46. A stack of chips 50 is placed in the well 46, while two chips 52 and 54 are placed in the well 44. Other chip arrangements are contemplated as well, and the particular arrangements are only by way of example.

In addition, the embodiment of FIG. 4 illustrates a second module 41 on which the module 40 is stacked. While the modules 40 and 41 are illustrated as identical, they may have different arrangements of wells and chips. Moreover, it should be recognized that the number of wells in each module is limited only by the area of the substrate, and in a practical case three or more wells may be incorporated. In addition, while only two modules are illustrated in the module stack, it is to be understood that the number of stacked modules is limited only by the needs and space requirements of the system.

In this embodiment, the stack 50 is a stack of memory chips, while the chips 52 and 54 are a processor and watchdog, respectively. All of the chips are bonded to their respective substrates by a bonding material 22.

In order to provide external top-surface electrical contact with the conductive overlay 33 and the vertical bus lines 34, a "via", such as the notch 35 of FIGS. 2A and 2B, is formed in the insulation layer 34. This is done, for example, by laser scribing. A patterned conductive layer (not shown in FIG. 4) can then be placed on the insulative layer 33' into contact with the layer 33 and the lines 34.

The vertical interconnects 34 shown in FIGS. 2B, 3A, 3B and, 3C are applicable to the arrangement of FIG. 4, and although not shown, the arrangement of FIG. 4 also utilizes horizontally positioned, over the top of the stack electrical connectors. As in FIGS. 3A and 3B, the top surfaces can be provided with a cap chip (not shown) which is insulated by a layer from each of the stacked modules, or the arrangement of FIG. 3C may be employed.

The Information Disclosure Statement filed with the parent application, incorporated herein by reference, shows proposed architectures for one Wafer Scale Vector (WSVP) or Signal Processor (WSSP) which is a flexible, high performance, multi-element super-scalar vector processor being developed by the United States Air Force Rome Laboratory and the Air Force Institute of Technology. By employing stacked hybrid wafer scale integration, the described processor achieves very low size, weight and power requirements, while the super-scalar vector architecture sustains high throughput on important signal processing problems. Since the basic element of the WSVP requires only about one square inch of area within a hybrid wafer substrate, a wide variety of multi-element WSVP architectures can be considered for any particular application.

Figure 5:
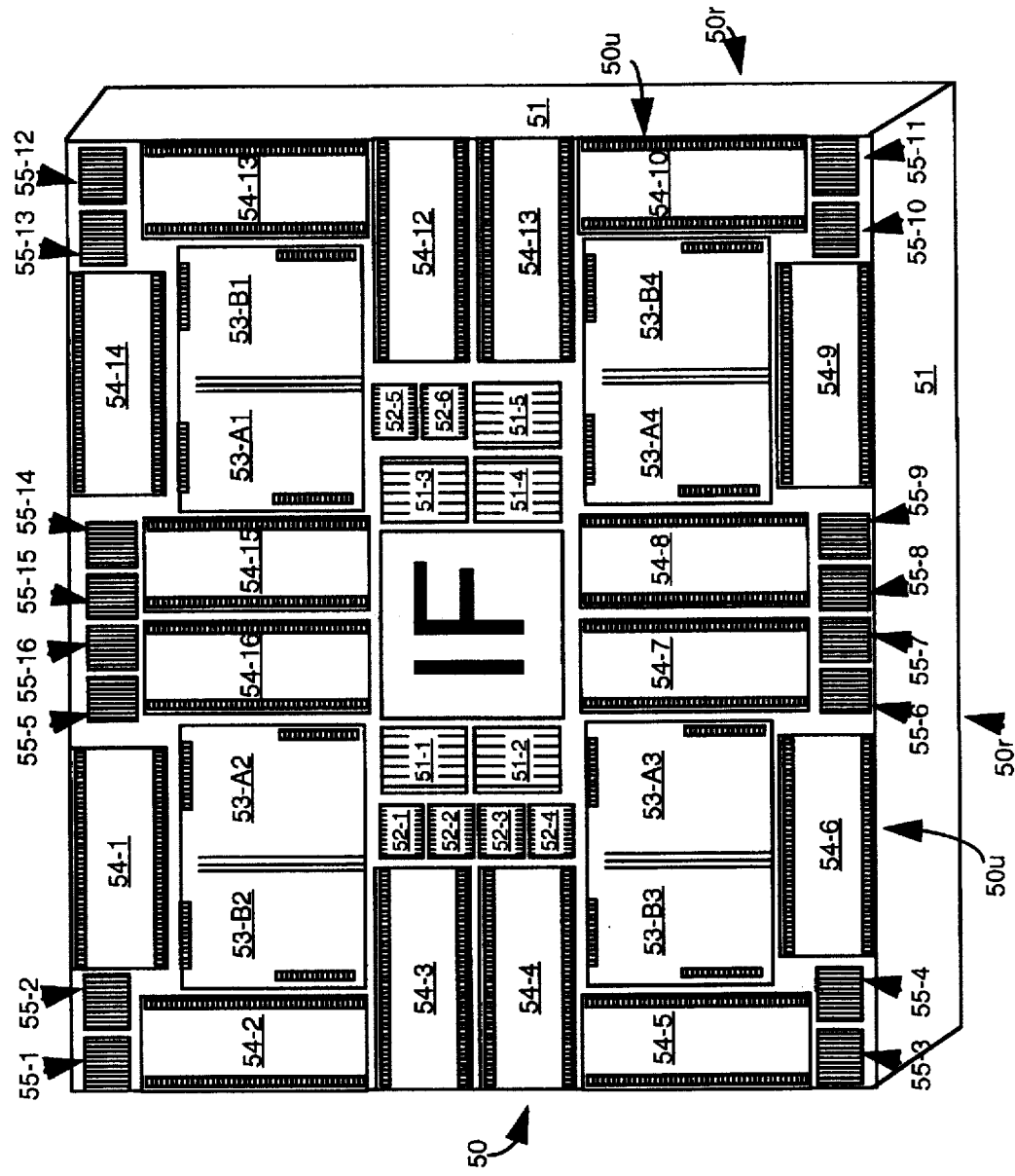
FIG. 5 is a "floor plan" of a signal processor employing chip-like stacks of the invention.

In addition, FIG. 5 shows the architecture or "floor plan" of a WSSP overall processor of the kind mentioned above in which stack-like chips of the invention are placed in wells or depressions of the kind discussed above in a substrate 51 and used to form a processor with planar upper and lower surfaces 50u and 50r that facilitate densification, stacking and heat transfer.

The unit 50 of FIG. 5 includes a central interface connector chip "IF" flanked by buffer interface chips 51-1 thru 51-5, which are in turn flanked by storage capacitors 52-1 thru 52-8. Four sets of internal processors "A" and "B", labelled 53-A1 thru 53-A4 and 53-B1 thru 53-B4 are at the corners of the IF pad, and memory storage units 54-1 thru 54-16 are associated with the respective internal processors "A" and "B". The remaining units 55-1 through 55-16 are by-pass capacitors associated with the various memory units. The processors "A" and "B" can operate independently, or as a watchdog processing pair as discussed above.

It will be noted that the linear arrays of small rectangles extending along the edges of the various units constitute electrical contact points of the kinds discussed above.

For clarity, the insulation used on the upper surface 50u have been omitted, as has the laser "vias", i.e. entry positions that permit external electrical connection to the various conductive pads on the stack-like chips and other elements forming the overall unit 50.

In the method of producing, the invention's stacks of integrated circuit (IC) chips are fabricated, for example, in accordance with the teaching of Minahan et al, U.S. Pat. No. 5,279,991, issued Jan 18, 1994.

Once the chips are formed, a conventional substrate is modified by the formation of depression, such as the wells $2_2$ of FIGS. 2A, 2B and the wells 44 and 46 of FIG. 4. These wells can be formed by machining, etching, molding or in any other suitable fashion.

Following well formation in the substrate, e.g., 21 and 41 or 42, stacks of chips 20, 50, 52 and 54 are placed in the wells so that the stack is vertically oriented with respect to the base and upper surface of the substrate 21, 41 or 42.

Further steps include connecting to a wafer positioned in a well 22, 44 or 46 in a substrate 21, 41 or 42 and by a vertical bus 34 extending to a patterned overlay 33 or to a cap chip 36 energizing a connection to the wafer, e.g., 52, positioned in the well 44 of the substrate 42.

The wafer 52 can be a component of a stack of wafers 52 and 54 positioned in the well 44, and a further step is to energize the stack of wafers 52 and 54 positioned in the well 44 of the substrate.

The substrate 21, 41 or 42 can have a planar surface, and the wafers e.g., 52 and 54 also can have planar surfaces. The wafers 52 and 54 can be mounted upon one another in chip-like fashion, and bear imprinted electrical circuitry (not shown), with the stack having a side connection 34 to external circuitry. The stack has a top with respect to the well 44 and a further step is to extending the side connection 34 to electrical circuitry along the top of the stack by a patterned overlay 33 or a cap chip 36.

The method of the further step includes providing electrical circuitry on the wafers 23, 24, 25 and 26(see FIG. 3C). The electrical circuitry on the wafers 23, 24, 25 and 26 can be implemented by printing. In a further step connection is made to the electrical circuitry on the wafers 23, 24, 25 and 26.

Each stack has an outer surface, and a further step is to connect the electrical circuitry of the wafers 23, 24, 25 and 26 to the outer surface of the stack. The well 22, 44 or 46 can have a receiving surface to which the stack is conformed. Each wafer has a height and the well 22, 44 or 46 can have a depth exceeding the height of the stack.

The substrate 21 has a surface surrounding the well 22, and a further step is to provide a patterned overlay 33 which can be insulated by a layer 34, on the surrounding surface. The stack can be bonded to the substrate in the well.

Another aspect of the method includes supplementing a well, such as well 44, by a further well, such as well 46, in the substrate 41 or 42 and positioning a further stack 50 in the further well 44 of the substrate 41 or 42.

Many modifications and variations of the present invention are possible in light of the above teachings and are within the scope of the inventive concept.

I claim:

1. A chip-like stack of wafers comprising:

at least one of said wafers having side and top surfaces;

said at least one wafer having further a beveled edge extending between said side and top surfaces;

conductive means connected to said at least one wafer;

said conductive means extending along the side surface over said beveled edge to the top surface; and said conductive means being further connected electrically to side surfaces of all other wafers in said chip-like stack.

2. The method of using an integration module, comprising the steps of:

(a) connecting to a first water positioned in a well in a substrate, said first wafer having a beveled edge extending between a side and a top surface, and said first wafer being a component of a stack of wafers positioned in said well, the members of said stack being connected to each other along their side surfaces; and (b) energizing a connection to said first wafer.

3. The method as defined in claim 2, further including the step of energizing said stack of wafers.

* * * * *